(12) United States Patent
Athreya et al.

(10) Patent No.: US 9,780,510 B2
(45) Date of Patent: Oct. 3, 2017

(54) SOCKET CONTACT TECHNIQUES AND CONFIGURATIONS

(71) Applicant: INTEL CORPORATION, Santa Clara, CA (US)

(72) Inventors: Dhanya Athreya, Chandler, AZ (US); Gaurav Chawla, Tempe, AZ (US); Kemal Aygun, Chandler, AZ (US); Glen P. Gordon, Graham, WA (US); Sarah M. Canny, Hillsboro, OR (US); Jeffory L. Smalley, East Olympia, WA (US); Srikant Nekkanty, Chandler, AZ (US); Michael Garcia, Chandler, AZ (US); Joshua D. Heppner, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/764,931

(22) PCT Filed: Sep. 26, 2014

(86) PCT No.: PCT/US2014/057686
§ 371 (c)(1),
(2) Date: Jul. 30, 2015

(87) PCT Pub. No.: WO2016/048352
PCT Pub. Date: Mar. 31, 2016

(65) Prior Publication Data
US 2016/0254629 A1   Sep. 1, 2016

(51) Int. Cl.
*H01R 24/00* (2011.01)
*H01R 33/76* (2006.01)
(Continued)

(52) U.S. Cl.
CPC ......... *H01R 33/7685* (2013.01); *H01L 23/32* (2013.01); *H01L 23/49827* (2013.01); *H01L 2924/0002* (2013.01)

(58) Field of Classification Search
CPC ..................... H01R 33/7685; H01L 23/32
(Continued)

(56) References Cited

U.S. PATENT DOCUMENTS

| 5,324,205 A | * | 6/1994 | Ahmad | ............... H01R 12/714 439/66 |
| 6,561,819 B1 | * | 5/2003 | Huang | ............... H05K 7/1069 439/66 |

(Continued)

FOREIGN PATENT DOCUMENTS

| JP | S5814080 B2 | 3/1983 |
| JP | 1983-014080 A | 10/1984 |

(Continued)

OTHER PUBLICATIONS

International Search Report and Written Opinion mailed Jun. 19, 2015, issued in corresponding International No. PCT/US2014/057686, 11 pages.

(Continued)

*Primary Examiner* — Abdullah Riyami
*Assistant Examiner* — Nader Alhawamdeh
(74) *Attorney, Agent, or Firm* — Schwabe, Williamson & Wyatt, P.C.

(57) ABSTRACT

Embodiments of the present disclosure are directed towards socket contact techniques and configurations. In one embodiment, an apparatus may include a socket substrate having a first side and a second side disposed opposite to the first side, an opening formed through the socket substrate, an electrical contact disposed in the opening and configured to route electrical signals between the first side and the second (Continued)

side of the socket substrate, the electrical contact having a cantilever portion that extends beyond the first side, wherein the first side and surfaces of the socket substrate in the opening are plated with a metal. Other embodiments may be described and/or claimed.

11 Claims, 6 Drawing Sheets

(51) Int. Cl.
  *H01L 23/32* (2006.01)
  *H01L 23/498* (2006.01)
(58) Field of Classification Search
  USPC .......................................... 439/660
  See application file for complete search history.

(56) References Cited

U.S. PATENT DOCUMENTS

| | | | |
|---|---|---|---|
| 7,530,814 B2* | 5/2009 | Ramaswamy | H01R 13/2442 439/66 |
| 8,025,531 B1* | 9/2011 | Zhang | H01R 12/52 439/607.05 |
| 8,133,061 B1* | 3/2012 | Ayers, Sr. | H01R 12/714 439/66 |
| 8,531,821 B2* | 9/2013 | Holzman | H05K 3/3436 361/676 |
| 2004/0056298 A1* | 3/2004 | Stone | H01L 23/49805 257/308 |
| 2006/0094266 A1 | 5/2006 | Liao et al. | |
| 2007/0105406 A1* | 5/2007 | Li | H01R 13/2435 439/66 |
| 2009/0004890 A1* | 1/2009 | Chiu | H01R 13/2407 439/66 |
| 2009/0029568 A1* | 1/2009 | Ju | H05K 7/1069 439/66 |
| 2009/0042413 A1* | 2/2009 | Ma | H01R 12/716 439/66 |
| 2009/0053914 A1* | 2/2009 | Ma | H01R 12/89 439/83 |
| 2009/0325398 A1* | 12/2009 | Ma | H01R 12/57 439/66 |
| 2010/0078781 A1* | 4/2010 | Ganesan | H01L 23/367 257/664 |
| 2011/0159737 A1* | 6/2011 | Lin | H01R 12/7082 439/626 |
| 2012/0149249 A1* | 6/2012 | Ihara | H01R 12/714 439/660 |
| 2012/0258636 A1* | 10/2012 | Horikawa | H01R 12/52 439/660 |
| 2012/0295490 A1* | 11/2012 | Schneider | H01R 12/91 439/709 |
| 2013/0210276 A1* | 8/2013 | Rathburn | H01R 11/16 439/620.22 |
| 2013/0231009 A1* | 9/2013 | Jeon | H01R 13/2442 439/660 |
| 2013/0237091 A1* | 9/2013 | Mason | H01R 13/6585 439/607.05 |
| 2013/0267103 A1* | 10/2013 | Kuwahara | H01R 12/7082 439/66 |
| 2013/0330969 A1* | 12/2013 | Avery | H01R 13/2442 439/607.01 |
| 2014/0038438 A1* | 2/2014 | Chang | H01R 12/71 439/76.1 |
| 2014/0162474 A1 | 6/2014 | Chawla et al. | |
| 2016/0254629 A1* | 9/2016 | Athreya | H01L 23/49827 439/660 |

FOREIGN PATENT DOCUMENTS

| | | |
|---|---|---|
| JP | H11233217 A | 8/1999 |
| TW | M446989 U | 2/2013 |

OTHER PUBLICATIONS

Office Action mailed Nov. 29, 2016 for Japanese Patent Application No. 2016-550461, 7 pages.
Search Report mailed Feb. 20, 2017 for Taiwanese Patent Application No. 104127714, 2 pages.

\* cited by examiner

SOCKET CONTACT TECHNIQUES AND CONFIGURATIONS

CROSS-REFERENCE TO RELATED APPLICATION

The present application is a national phase entry under 35 U.S.C. §371 of International Application No. PCT/US2014/057686, filed Sep. 26, 2014, entitled "SOCKET CONTACT TECHNIQUES AND CONFIGURATIONS," which designates the United States of America, the entire disclosure of which is hereby incorporated by reference in its entirety and all purposes.

FIELD

Embodiments of the present disclosure generally relate to the field of integrated circuits, and more particularly, to socket contact techniques and configurations.

BACKGROUND

Socket connections for emerging high performance devices such as, for example, a central processing unit (CPU) may have more stringent electrical specifications for insertion loss (IL), return loss (RL), and impedance discontinuity (DZ) in order to meet faster targeted signaling speed of the CPU (e.g., 32 gigabytes per second (Gbps) or faster). Further, socket contacts may be fragile in nature and exposed to bending or other damage during handling or assembly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
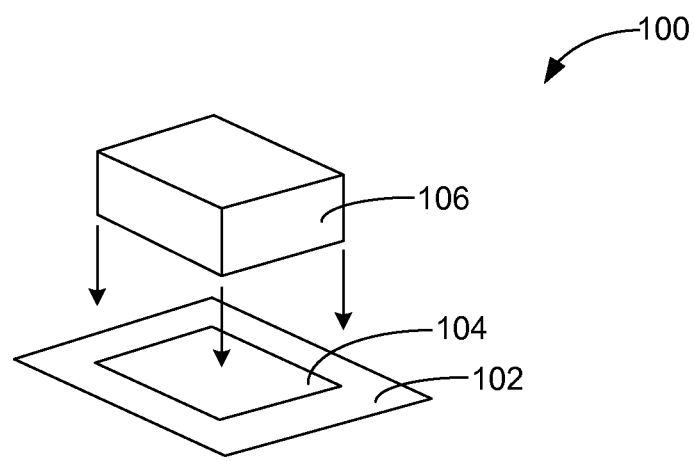
FIG. 1 schematically illustrates a perspective view of an example integrated circuit (IC) package assembly, in accordance with some embodiments.

Embodiments of the present disclosure describe socket contact techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a perspective view of an example integrated circuit (IC) package assembly 100, in accordance with some embodiments. The IC package assembly 100 may include a socket assembly 104 coupled with a circuit board or other suitable electronic substrate ("hereinafter circuit board 102"). The IC package assembly 100 may further include a die or die package (hereinafter "die package 106") electrically coupled with the circuit board 102 through the socket assembly 104.

The socket assembly 104 may include, for example, a land-grid array (LGA) socket having an array of electrical contacts that are configured to route electrical signals between the die package 106 and the circuit board 102. According to various embodiments, the socket assembly 104 may comport with embodiments described herein. For example, in some embodiments, a socket housing and electrical contacts of the socket assembly may comport with embodiments described in connection with FIG. 4 to increase electrical performance and scalability or the socket assembly 104 may comport with embodiments described in connection with FIGS. 5a-8b to include a protective cover for housing and seating of the electrical contacts, or suitable combinations of these embodiments.

In some embodiments, the circuit board 102 may be a printed circuit board (PCB) composed of an electrically insulative material such as an epoxy laminate. The circuit board 102 may include electrically insulating layers composed of materials such as, for example, polytetrafluoroethylene, phenolic cotton paper materials such as Flame Retardant 4 (FR-4), FR-1, cotton paper and epoxy materials including composite epoxy material (CEM) such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die package 106 through the circuit board 102. The circuit board 102 may be composed of other suitable materials in other embodiments. For example, in some embodiments, the circuit board 102 may be an epoxy-based laminate substrate having a core and/or build-up layers such as, for example, an Ajinomoto Build-up Film (ABF) substrate. In some embodiments, the circuit board 102 is a motherboard (e.g., motherboard 1002 of FIG. 10).

The die package 106 may include one or more dies in any of a wide variety of suitable configurations. For example, the die package 106 may be a central processing unit (CPU) package in one embodiment. The die package 106 may include one or more dies that are encapsulated, at least partially, in a protective enclosure such as, for example, a mold compound or other suitable protective housing. In some embodiments, the die package 106 may include alignment features to facilitate coupling of the die package 106 with corresponding alignment features of the socket assembly 104.

The die package 106 may include one or more dies made from a semiconductor material (e.g., silicon) and having circuitry formed using semiconductor fabrication techniques such as thin film deposition, lithography, etching and the like used in connection with forming complementary metal-oxide-semiconductor (CMOS) devices. In some embodiments, the one or more dies of the die package 106 may be, include, or be a part of a processor, memory, SoC or ASIC. The one or more dies in the die package 106 may include a wide variety of configurations including, for example, suitable combinations of flip-chip and/or wire-bonding configurations, interposers, multi-chip package configurations including system-in-package (SiP) and/or package-on-package (PoP) configurations.

Figure 2:
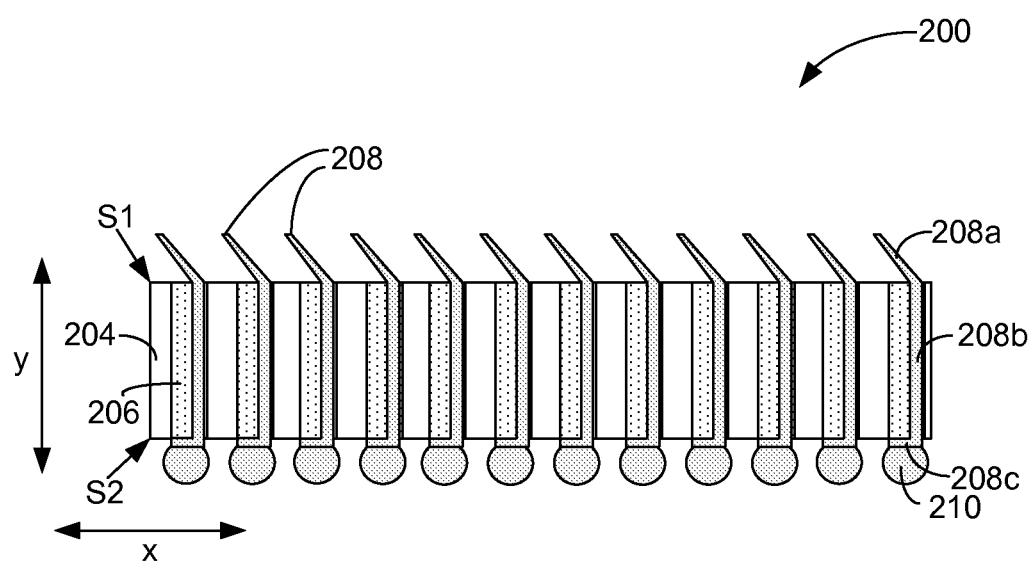
FIG. 2 schematically illustrates a cross-section side view of an example socket assembly including socket housing with electrical contacts, in accordance with some embodiments.

FIG. 2 schematically illustrates a cross-section side view of an example socket assembly 200 including socket housing 204 with electrical contacts 208, in accordance with some embodiments. In some embodiments, the socket housing 204 (also referred to as "socket substrate" herein) may include a plurality of openings 206 disposed between a first side, S1, and opposing second side, S2, of the socket housing 204, as can be seen. The electrical contacts 208 may be physically coupled with the socket housing 204 in corresponding openings of the plurality of openings 206. For example, the electrical contacts 208 may be physically coupled with the socket housing 204 using mechanical stitching features. In some embodiments, the electrical contacts 208 may extend through the openings 206 to route electrical signals such as, for example, input/output (I/O) signals or power/ground of a die (e.g., die package 106 of FIG. 1), through the socket housing 204.

The socket housing 204 may be composed of any of a wide variety of suitable materials including, for example, polymers, ceramics or semiconductor materials. The socket housing 204 may be composed of other suitable materials in other embodiments.

The electrical contacts 208 may be leads of an LGA socket configuration in some embodiments. For example, the electrical contacts 208 may be J-leads, which may be so named because, from a side view, each of the J-leads may have a profile resembling the letter J, as can be seen. The electrical contacts 208 may be composed of an electrically conductive material such as metal. In some embodiments, the electrical contacts 208 may comport with embodiments described in connection with FIGS. 3-8b and vice versa.

In some embodiments, each of the electrical contacts 208 may have a contact portion 208a, a leg portion 208b, and a foot portion 208c, as can be seen. The contact portion 208a may extend beyond a surface of the socket housing 204 to make electrical contact with corresponding interconnect features on a die package (e.g., die package 106 of FIG. 1). The leg portion 208b may extend through the openings 206. The foot portion 208c (sometimes referred to as "paddle") may have a surface that is configured to directly couple with solderable material 210 (e.g., solder ball) to form a solder joint (e.g., between a socket assembly 104 and a circuit board 102 of FIG. 1).

In some embodiments, the leg portion 208b may extend in a first direction, indicated by the x-axis, and the foot portion 208c may include a surface that extends in a second direction, indicated by the y-axis, that is perpendicular to the first direction, as can be seen. In various embodiments, the leg portion 208b may extend away from the surface of the foot portion 208c at an angle that is substantially perpendicular (e.g., +/−10° of being perpendicular) or that angles away (e.g., +/−40° of being perpendicular). The profile shape of the electrical contacts 208 is merely one example and may include any of a wide variety of other profile shapes in other embodiments.

Figure 3:
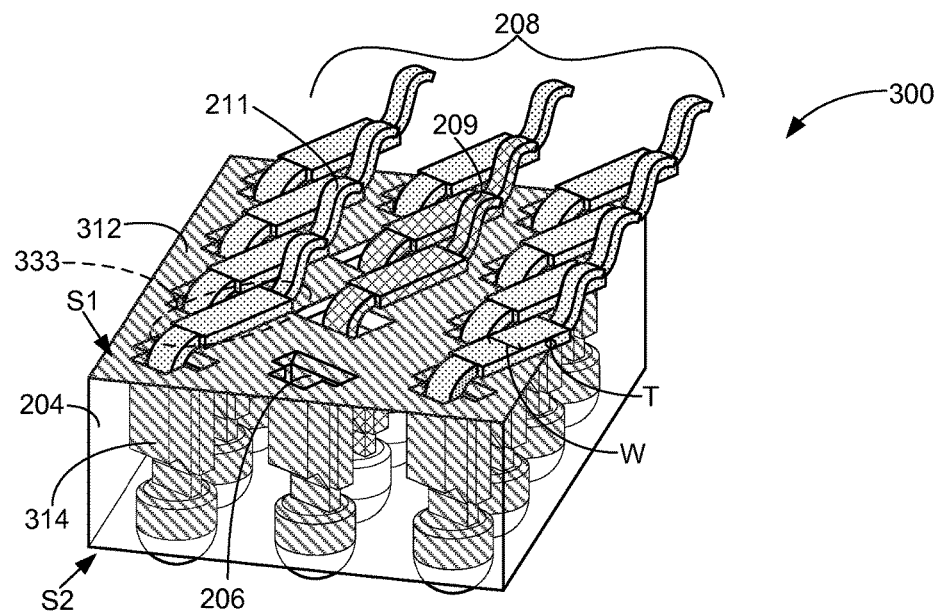
FIG. 3 schematically illustrates a partially transparent cross-section perspective view of a socket contact configuration, in accordance with some embodiments.

FIG. 3 schematically illustrates a partially transparent cross-section perspective view of a socket contact configuration 300, in accordance with some embodiments. In the socket contact configuration 300, the socket housing 204 is transparently depicted to show underlying features.

The socket housing 204 may include openings 206 between a first side S1 and second side S2, the openings 206 having electrical contacts 208 disposed through the openings 206. The electrical contacts 208 may include one or more ground contacts 211 and one or more signal contacts 209. The ground contacts 211 may be configured to route ground supply between a circuit board (e.g., circuit board 102 of FIG. 1) and die package (e.g., die package 106 of FIG. 1). The signal contacts 209 may be configured to route I/O signals between the circuit board and the die package.

In some embodiments, the socket housing 204 may include metal plating 312, 314 disposed on one or more surfaces of the socket housing 204. In one embodiment, the socket contact configuration 300 may include metal plating 312 disposed on the first side S1 of the socket housing 204, metal plating 314 disposed on surfaces of the socket housing 204 in the openings 206, and no metal plating disposed on the second side S2 of the socket housing 204. In some embodiments, the metal plating 312 may be disposed in openings 206 corresponding with ground contacts 211 and no metal plating 312 may be disposed in openings 206 corresponding with signal contacts 209, as can be seen. In some embodiments, the metal plating 312 and/or 314 may be electrically coupled with the ground contacts 211 such that the ground contacts 211 and the metal plating 312 and/or 314 are shorted together. For example, in one embodiment, the ground contacts 211 may be in direct contact with the metal plating 314 within the openings 206. The metal plating 312 and/or 314 may result in or increase capacitive coupling between the electrical contacts 208 and the metal plating 312 and/or 314, which may reduce an inductive peak and/or improve an impedance profile of the electrical contacts 208 with fewer discontinuities. The metal plating 314 within the openings 206 may reduce cross talk between adjacent electrical contacts 208. The socket contact configuration 300 may also have reduced insertion loss and return loss relative to configurations where metal plating is not disposed on the surfaces in the openings 206 and/or on the first side S1. In some embodiments, having no metal plating on the second side S2 of the socket housing 204 may reduce a capacitive impedance discontinuity relative to socket housing 204 having metal plating on the second side S2 of the socket housing 204. Such improvements in electrical characteristics may increase a high speed performance (e.g., 32 gigabits per second) of the socket contact configuration 300 as a connector for high speed devices such as for emerging central processing units (CPUs).

The metal plating 312, 314 may have a substantially uniform, conformal thickness on deposited surfaces. In some embodiments, a thickness of the metal plating 312, 314 may range from 1 micron to 20 microns. In some embodiments, the metal plating 312, 314 may include copper. The metal plating 312, 314 may be deposited using any suitable technique including, for example, electroless plating. In some embodiments, the metal may be deposited on the second side S2 and removed using any suitable technique, such as, for example, etching. The metal plating 312, 314 may include other thicknesses, suitable metals and/or may be deposited using other suitable techniques in other embodiments.

In some embodiments, the contact portion (e.g., contact portion 208a of FIG. 2) of the electrical contacts 208 may include a cantilever portion 333 that provides spring flexibility to accommodate loading of a die package. According to various embodiments, the cantilever portion 333 may be widened to increase capacitive coupling between the electrical contacts 208 and the metal plating 312 to improve electrical characteristics of a socket connector including the socket contact configuration 300 to increase signaling performance and speed.

In one embodiment, the cantilever portion 333 may have a width, W, and/or thickness, T, that increases and then decreases in a direction along the cantilever portion 333 from the opening 206 at the first side S1 toward a terminating end of the electrical contacts 208 that is configured to make electrical contact with a die package, as can be seen. The cantilever portion 333 or a portion of the cantilever portion 333 may be wider than portions of the electrical contacts 208 that adjoin the cantilever portion 333 on both sides. In some embodiments, the widened area of the cantilever portion 333 may have a rectangular profile, as can be seen. The widened area may have other suitable shapes in other embodiments.

Figures 4A, 4B:
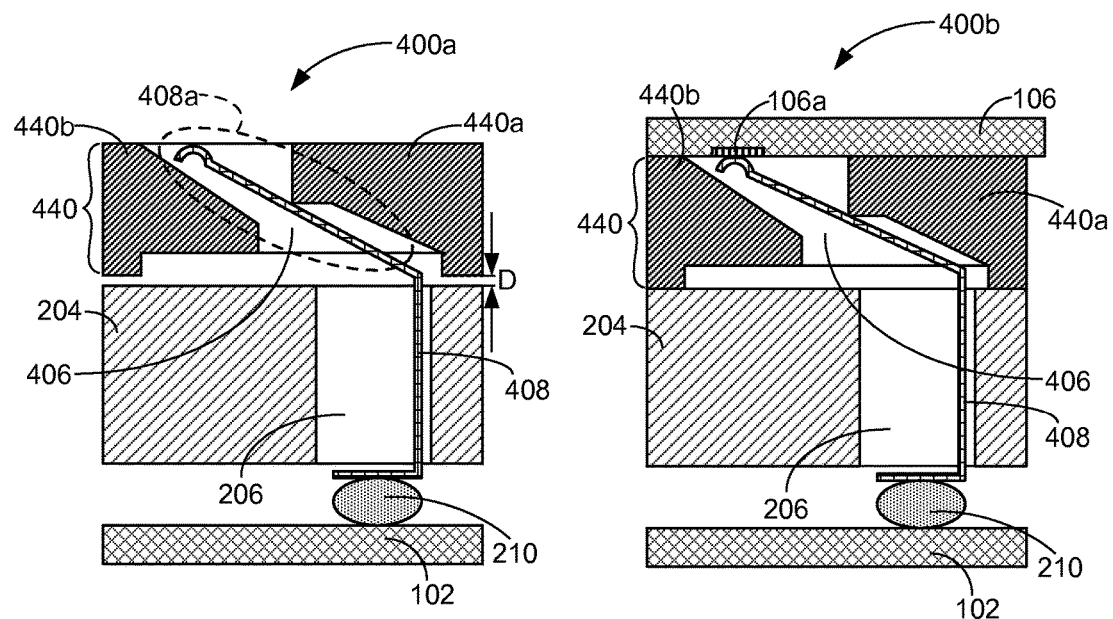
FIGS. 4a-4b schematically illustrate a cross-section side view of a socket contact configuration including a protective cover in an unloaded state and a loaded state, in accordance with some embodiments.

FIGS. 4a-4b schematically illustrate a cross-section side view of a socket contact configuration including a protective cover (hereinafter "cover 440") in an unloaded state 400a and a loaded state 400b, in accordance with some embodiments. The electrical contact 408 and the socket housing 204 may comport with embodiments described in connection with the electrical contacts 208 and socket housing 204 of FIGS. 1-3 and vice versa.

In some embodiments, a cover 440 may be disposed on or over the socket housing 204 to provide protection and a loading barrier for a contact portion 408a of the electrical contact 408. For example, an opening 406 (also called "relief") may be formed between a first side and opposing second side of the cover 440 to accommodate the contact portion 408a of the electrical contact 408, as can be seen. A first portion 440a of the cover 440 may be configured to be in direct physical contact with the contact portion 408a such as, for example, a cantilever portion (e.g., cantilever portion 333 of FIG. 3) of the electrical contact 408. In some embodiments, the first portion 440a may contact the contact portion 408a when the cantilever portion is in an unloaded state 400a and a loaded state 400b. In some embodiments, the first portion 440a may contact the contact portion 408a only when the cantilever portion is in a loaded state 400b (e.g., when the cover 440 is coupled with the socket housing 204 using a spring structure other than the cantilever portion of the electrical contact 408).

When the cover 440 is in place over the socket housing 204, the first portion 440a may protect the contact portion 408a from handling that would otherwise bend or damage the contact portion 408a. The first portion 440a may reduce exposure of the contact portion 408a. The first portion 440a may further help position the contact portion 408a. In some embodiments, the first portion 440a may position the contact portion 408a such that the contact portion 408a is disposed just below a surface of the cover 440 (e.g., between the first side and the second side) to protect the contact portion 408a from exposure in the unloaded state 400a, as can be seen, and to position the contact portion 408a such that the contact portion 408a can make contact with a corresponding contact 106a on the die package 106 in the loaded state. In some embodiments, in the loaded state 400b, the cover 440 may not have a reactive load or minimal amount from the electrical contact 408.

A second portion 440b of the cover 440 may be disposed opposite to the first portion 440a across the opening 406. The second portion 440b may be configured to serve as a barrier or hard stop such as, for example, an interstitial seating plane (ISP) to prevent overdeflection of the contact portion 408a (e.g., cantilever portion) when loading the die package 106 on the cover 440 to provide the loaded state 400b. Providing the cover 440 with the second portion 440b may allow the socket housing 204 to have a substantially planar top surface, which may be more conducive to a selective plating process to form plating 312, 314 of FIG. 3.

In some embodiments, in the unloaded state 400a, the cover 440 may be separated from the socket housing 204 by a distance, D, until a compressive force is applied to compress the springs to expose the contact portion 408a of the electrical contact 408. In some embodiments, the distance D may correspond with an actuation/deflection range of the electrical contact 408. For example, in the loaded state 400b, the die package 106 may be placed on the cover 440 with a compressive force to make contact between the contact portion 408a of the electrical contact 408 and a corresponding contact 106a on the die package 106. In some embodiments, the springs may include one or more spring structures that are used to couple the cover 440 with the socket housing 204 or the springs may include the cantilever portions of the electrical contacts, or combinations thereof.

According to various embodiments, the cover 440 may be composed of a polymer such as, for example, liquid crystal polymer (LCP) and may be manufactured by injection molding to provide a unitary, molded body. Material of the cover 440 may be contiguous. The cover 440 may be composed of other suitable materials or manufactured according to other suitable techniques in other embodiments.

Figure 5:
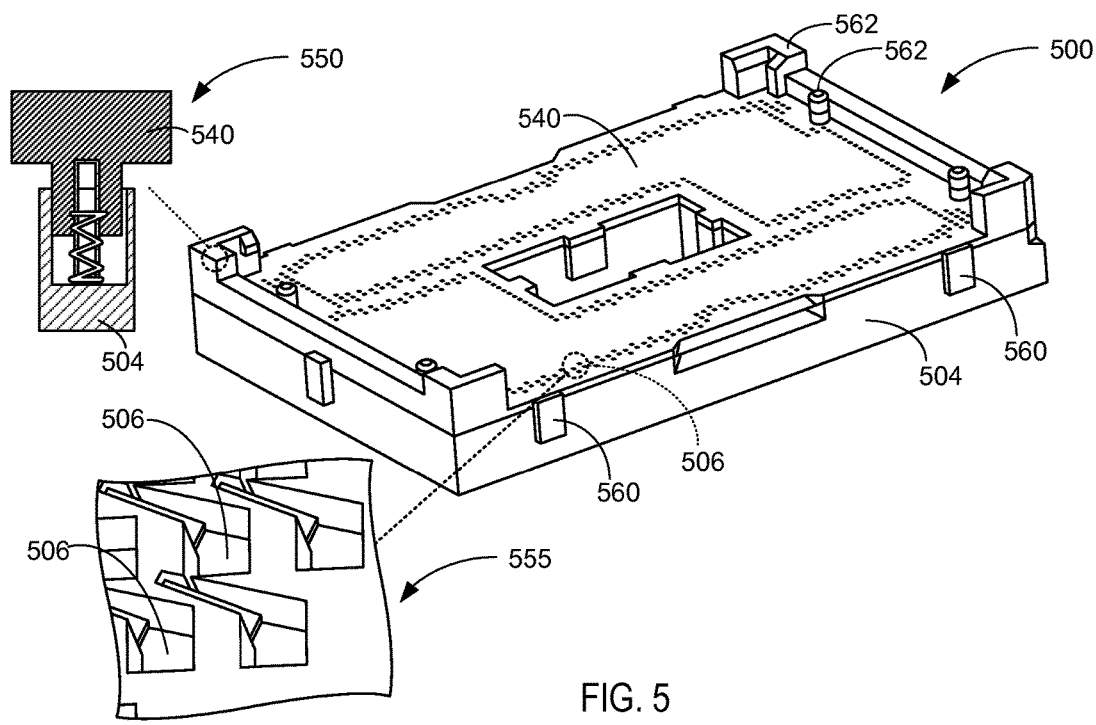
FIG. 5 schematically illustrates a perspective view of a socket assembly, in accordance with some embodiments.

FIG. 5 schematically illustrates a perspective view of a socket assembly 500, in accordance with some embodiments. The socket assembly 500 may include a socket housing 504 and cover 540, which may respectively comport with embodiments described in connection with socket housing 204 and cover 440 of FIG. 4 in some embodiments.

The cover 504 may include a plurality of openings 506, each of which may comport with embodiments described in connection with opening 406 of FIGS. 4a-b. In some embodiments, the openings 506 may have a structural configuration as depicted in the enlarged view 555.

The cover 540 may be coupled with the socket housing 504 using a spring-loaded connection. In some embodiments, one or more spring structures 550 may be disposed between the socket housing 504 and the cover 540 at one or more respective corners of the socket assembly 500. For example, the one or more spring structures 550 may be configured to provide the distance D between the cover 440 and the socket housing 204 in the unloaded state 400a of FIG. 4a. In other embodiments, the one or more spring structures 550 may be located at a position other than a corner of the socket assembly 500.

In some embodiments, the cover 540 and/or the socket housing 504 may include one or more alignment features to facilitate alignment between the cover 540 and the socket housing 504. For example, in the depicted embodiment, the cover 540 may include one or more clips 560 that are configured to mate with corresponding structures of the socket housing 504. In some embodiments, the cover 540 may include alignment features 562 to facilitate alignment with a die package (e.g., die package 106 of FIG. 1). The alignment features for aligning the cover 540 with the socket housing 504 or the cover 540 with the die package may include other suitable structures in other embodiments.

Figure 6A:
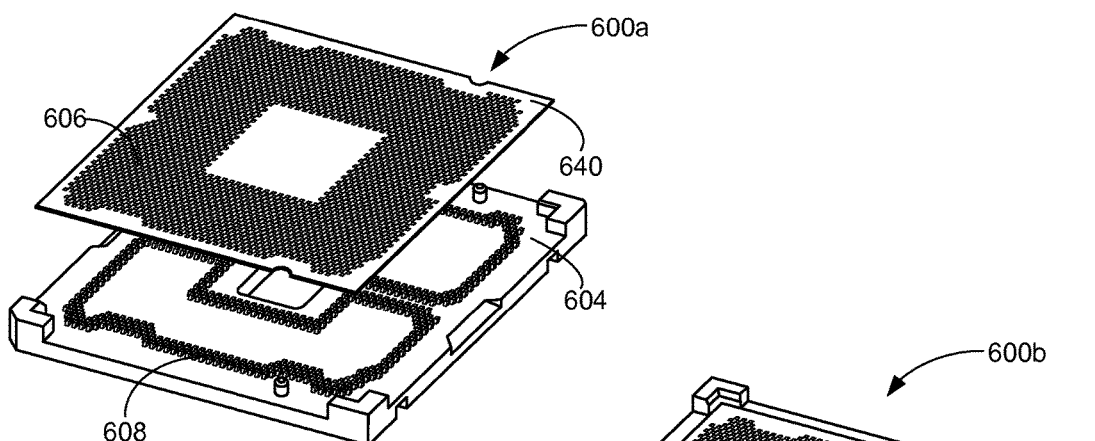
FIGS. 6a-b schematically illustrate a perspective view of a socket assembly before placing a cover and after placing the cover, in accordance with some embodiments.
Figure 6B:
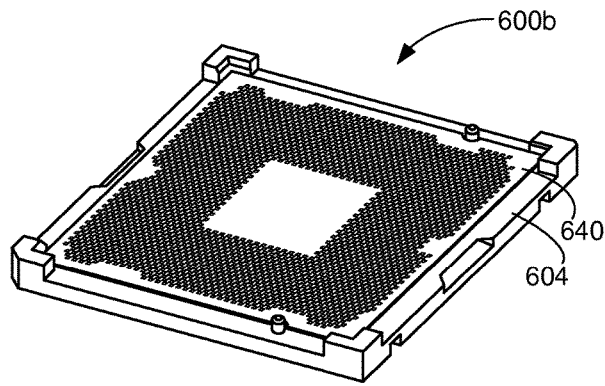

FIGS. 6a-b schematically illustrate a perspective view of a socket assembly 600a before placing a cover 640 and the socket assembly 600b after placing the cover 640, in accordance with some embodiments. In some embodiments, the socket assembly 600a or 600b may include a socket housing 604 and cover 640, which may respectively comport with embodiments described in connection with socket housing 204 and cover 440 of FIG. 4 in some embodiments.

In some embodiments, a plurality of electrical contacts 608 may be disposed in the socket housing 604 and the cover 640 may include a corresponding plurality of openings 606, as can be seen in the socket assembly 600a before placing the cover 640. Individual electrical contacts 608 may comport with embodiments described in connection with electrical contact 408 and the individual openings of the plurality of openings 606 may comport with embodiments described in connection with opening 406.

In some embodiments, the cover 640 in the socket assembly 600b may be placed on the electrical contacts 608 such that the electrical contacts 608 provide a spring mechanism to maintain a distance (e.g., distance D of FIG. 4a) between the cover 640 and the socket housing 604. The socket assembly 600b may be in an unloaded state.

Figure 7:
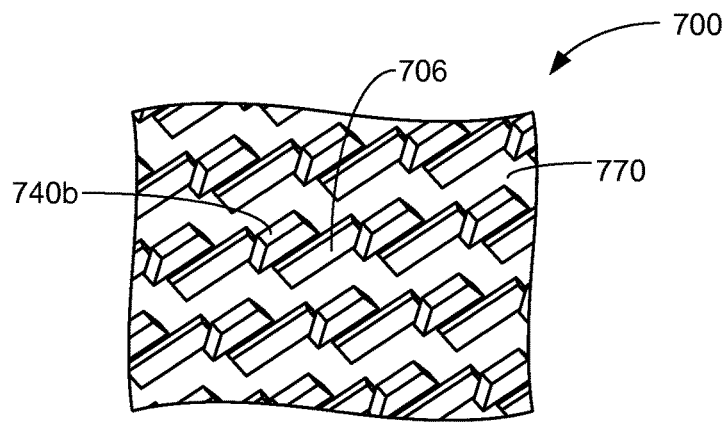
FIG. 7 schematically illustrates a bottom view of a cover of a socket assembly, in accordance with some embodiments.

FIG. 7 schematically illustrates a bottom view of a cover 700 of a socket assembly, in accordance with some embodiments. The cover 700 may represent the cover 640 of FIGS. 6a-b in some embodiments. The cover 700 may include a planar surface 770 having openings 706 formed through the cover 700. As can be seen, the cover 700 may include a plurality of barrier structures 740b, which may be referred to as "interstitial seating plane (ISP) structures." For example, an individual barrier structure of the barrier structures 740b may correspond with the second portion 440b of FIGS. 4a-b and an individual opening of the openings 706 may correspond with opening 406 of FIGS. 4a-b.

Figure 8A:
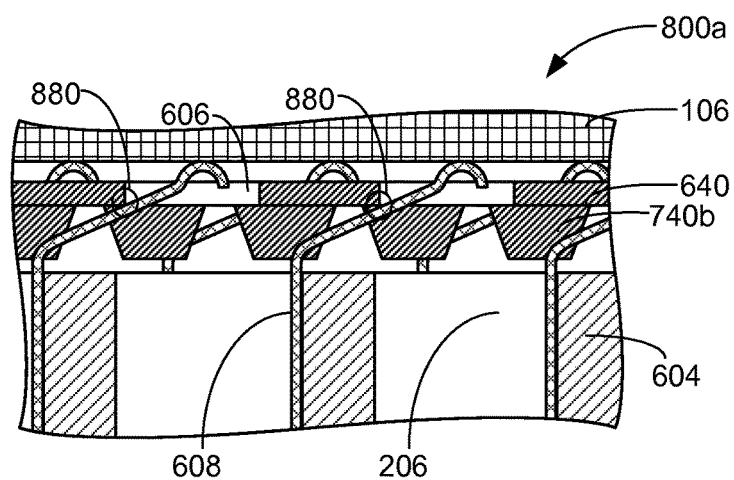
FIGS. 8a-b schematically illustrate a cross-section side view of a socket assembly in an unloaded state and in a loaded state, in accordance with some embodiments.
Figure 8B:
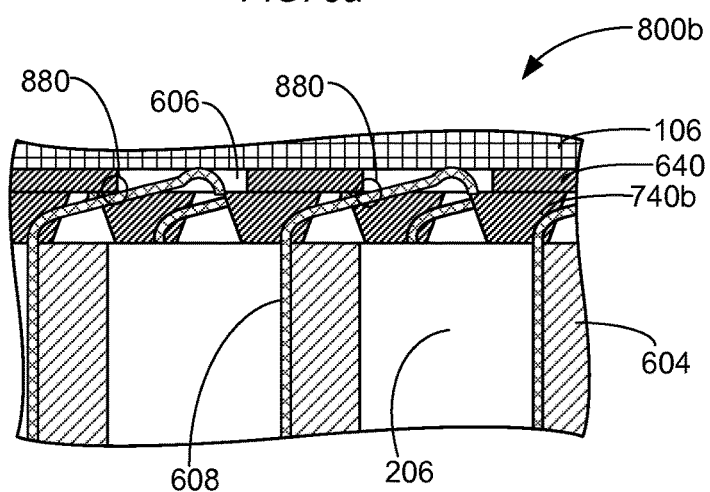

FIGS. 8a-b schematically illustrate a cross-section side view of a socket assembly 800a in an unloaded state and the socket assembly 800b in a loaded state, in accordance with some embodiments. The socket assembly 800a or 800b may represent embodiments described in connection with FIGS. 6a-b and 7 in some embodiments.

Referring to FIG. 8a, the socket assembly 800a may include a socket housing 604 with openings 206, a cover 640 with openings 606 and barrier structures 740b and electrical contacts 608 disposed in the openings 206 and 606, as can be seen. A die package 106 may be disposed above the cover 640 such that the cover 640 is in an uncompressed or unloaded state. The cover 640 may rest on the electrical contacts 608 at locations 880 where the cover 640 is in direct physical contact with the electrical contacts 608.

Referring to FIG. 8b, in the compressed or loaded state, the barrier structures 740b may contact the socket housing 604 to provide a hard stop that prevents overdeflection of the electrical contacts 608 and allows the socket housing 604 to bare the load. Using a cover (e.g., cover 440, 540, 640) may provide a variety of benefits. Socket housing 604 that includes ISP-type structures may allow a main socket housing design to remain the same for multiple products while the cover may be different for different products. Separate covers may aid with visual variation (e.g., unique cover color) for different products. Further, providing ISP-type structures (e.g., barrier structures 740b) on the cover may facilitate selective plating of socket housing having relatively flat surfaces devoid of raised ISP-type structures.

Figure 9:
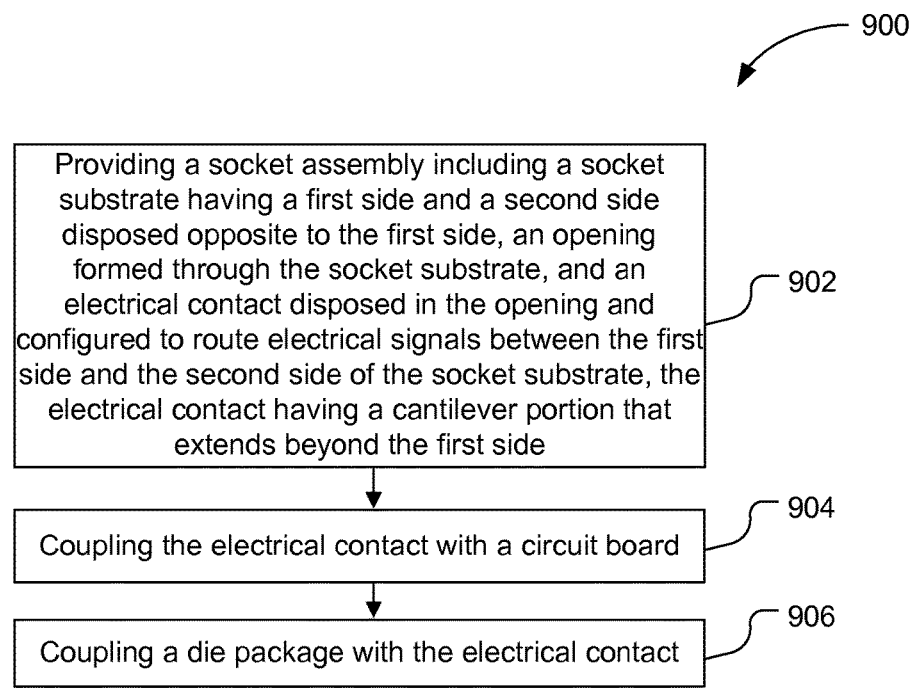
FIG. 9 schematically illustrates a flow diagram for a method of fabricating an IC package assembly, in accordance with some embodiments.

FIG. 9 schematically illustrates a flow diagram for a method 900 of fabricating an IC package assembly (e.g., IC package assembly 100 of FIG. 1), in accordance with some embodiments. The method 900 may comport with embodiments described in connection with FIGS. 1-8 and vice versa.

At 902, the method 900 may include providing a socket assembly (e.g., socket assemblies depicted in FIGS. 2-8b) including a socket substrate (e.g., socket substrate 204 of FIG. 2) having a first side (e.g., first side S1 of FIG. 2) and a second side (e.g., second side S2 of FIG. 2) disposed opposite to the first side, an opening (e.g., openings 206 of FIG. 2) formed through the socket substrate, and an electrical contact (e.g., electrical contacts 208 of FIG. 2) disposed in the opening and configured to route electrical signals between the first side and the second side of the socket substrate, the electrical contact having a cantilever portion (e.g., contact portion 208a of FIG. 2 or cantilever portion 333 of FIG. 3) that extends beyond the first side.

According to some embodiments, the first side and surfaces of the socket substrate in the opening may be plated with a metal (e.g., metal plating 312 and 314 of FIG. 3). In some embodiments, the second side of the socket substrate is not plated with a metal. According to some embodiments, the cantilever portion may have a width or thickness that increases and decreases in a direction along the cantilever portion from the opening toward a terminating end of the electrical contact that is configured to make electrical contact with a die package.

According to some embodiments, the socket assembly may further include a cover (e.g., cover 440 of FIGS. 4a-b) having a first side and a second side disposed opposite to the first side and an opening (e.g., opening 406 of FIGS. 4a-b) formed through the cover and configured to accommodate the cantilever portion such that a first portion (e.g., first portion 440a of FIGS. 4a-b) of the cover is configured to contact the cantilever portion and a second portion (e.g., second portion 440b of FIGS. 4a-b) of the cover serves as a barrier to prevent overdeflection of the cantilever portion when loading a die package on the cover. The socket assembly may comport with embodiments described in connection with FIGS. 5-8b in other embodiments.

At 904, the method 900 may include coupling the electrical contact with a circuit board (e.g., circuit board 102 of FIG. 1). For example, in some embodiments, the electrical contact may be brought into contact with solderable material to form a solder joint between the electrical contact and a corresponding contact (e.g., pad) on the circuit board using one or more solder reflow processes. The socket substrate may be coupled with the circuit board using other suitable techniques in other embodiments.

At 906, the method 900 may include coupling a die package with the electrical contact. For example, in some embodiments, the die package may be aligned with the socket assembly using alignment features and contacts on the die package may be compressed and seated against the electrical contacts to provide a loaded state that forms an electrical connection between the contacts on the die package and the electrical contacts. The die package may be coupled with the socket assembly using other suitable techniques in other embodiments.

Various operations are described as multiple discrete operations in turn, in a manner that is most helpful in understanding the claimed subject matter. However, the order of description should not be construed as to imply that these operations are necessarily order dependent.

Figure 10:
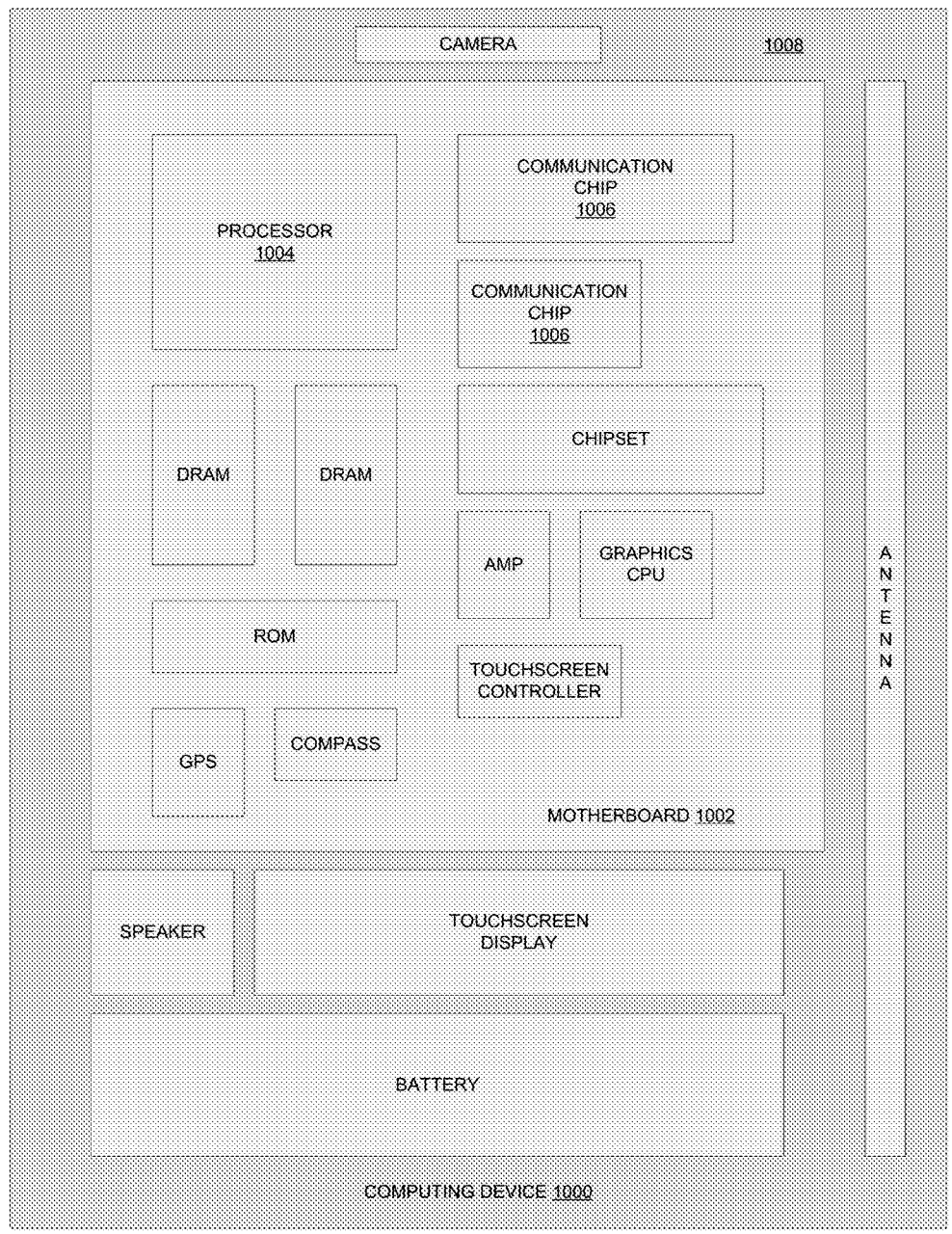
FIG. 10 schematically illustrates a computing device that includes an IC package assembly as described herein, in accordance with some embodiments.

Embodiments of the present disclosure may be implemented into a system using any suitable hardware and/or software to configure as desired. FIG. 10 schematically illustrates a computing device that includes an IC package assembly (e.g., IC package assembly 100 of FIG. 1) as described herein, in accordance with some embodiments. The computing device 1000 may house a board such as motherboard 1002 (e.g., in housing 1008). The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, EV-DO, and others.

The processor 1004 of the computing device 1000 may be packaged in an IC package assembly (e.g., IC package assembly 100 of FIG. 1) as described herein. For example, the circuit board 102 of FIG. 1 may be a motherboard 1002 and the processor 1004 may be a die of the die package 106 that is coupled with a socket assembly 104 as described herein and mounted on the circuit board 102. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 1006 may also include a die that may be packaged in an IC package assembly (e.g., IC package assembly 100 of FIG. 1) as described herein. In further implementations, another component (e.g., memory device or other integrated circuit device) housed within the computing device 1000 may include a die that may be packaged in an IC package assembly (e.g., IC package assembly 100 of FIG. 1) as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 1000 may be a mobile computing device in some embodiments. In further implementations, the computing device 1000 may be any other electronic device that processes data.

EXAMPLES

According to various embodiments, the present disclosure describes an apparatus. Example 1 of an apparatus may include a socket substrate having a first side and a second side disposed opposite to the first side, an opening formed through the socket substrate, an electrical contact disposed in the opening and configured to route electrical signals between the first side and the second side of the socket substrate, the electrical contact having a cantilever portion that extends beyond the first side, wherein the first side and surfaces of the socket substrate in the opening are plated with a metal. Example 2 may include the apparatus of Example 1, wherein the second side of the socket substrate is not plated with a metal. Example 3 may include the apparatus of Example 1, wherein the cantilever portion has a width or thickness that increases and decreases in a direction along the cantilever portion from the opening toward a terminating end of the electrical contact that is configured to make electrical contact with a die package. Example 4 may include the apparatus of Example 1, wherein the electrical contact is a ground contact and the opening is a first opening, the apparatus further comprising an input/output (I/O) signal contact disposed in a second opening formed through the socket substrate, wherein surfaces of the socket substrate in the second opening are not plated with a metal. Example 5 may include the apparatus of any of Examples 1-4, wherein the opening is a first opening, the apparatus further comprising a cover having a first side and a second side disposed opposite to the first side, a second opening formed through the cover and configured to accommodate the cantilever portion such that a first portion of the cover is configured to contact the cantilever portion and a second portion of the cover serves as a barrier to prevent overdeflection of the cantilever portion when loading a die package on the cover.

According to various embodiments, the present disclosure describes a method. Example 6 of a method may include providing a socket substrate including a first side and a second side disposed opposite to the first side, an opening formed through the socket substrate, an electrical contact disposed in the opening and configured to route electrical signals between the first side and the second side of the socket substrate, the electrical contact having a cantilever portion that extends beyond the first side, wherein the first side and surfaces of the socket substrate in the opening are plated with a metal, and coupling the electrical contact with a circuit board, wherein the electrical contact is configured to electrically couple with a die package. Example 7 may include the method of Example 6, wherein the second side of the socket substrate is not plated with a metal. Example 8 may include the method of Example 6, wherein the cantilever portion has a width or thickness that increases and decreases in a direction along the cantilever portion from the opening toward a terminating end of the electrical contact that is configured to make electrical contact with a die package. Example 9 may include the method of Example 6, wherein the electrical contact is a ground contact and the opening is a first opening, the method further comprising an input/output (I/O) signal contact disposed in a second opening formed through the socket substrate, wherein surfaces of the socket substrate in the second opening are not plated with a metal. Example 10 may include the method of any of Examples 6-9, wherein the opening is a first opening, the method further comprising a cover having a first side and a second side disposed opposite to the first side, a second opening formed through the cover and configured to accommodate the cantilever portion such that a first portion of the cover is configured to contact the cantilever portion and a second portion of the cover serves as a barrier to prevent overdeflection of the cantilever portion when loading a die package on the cover.

According to various embodiments, the present disclosure describes another apparatus. Example 11 of an apparatus may include a socket substrate having a first side and a second side disposed opposite to the first side, a first opening formed through the socket substrate, an electrical contact disposed in the first opening and configured to route electrical signals between the first side and the second side of the socket substrate, the electrical contact having a cantilever portion that extends beyond the first side, a cover having a first side and a second side disposed opposite to the first side, and a second opening formed through the cover and configured to accommodate the cantilever portion such that a first portion of the cover is configured to contact the cantilever portion and a second portion of the cover serves as a barrier to prevent overdeflection of the cantilever portion when loading a die package on the cover. Example 12 may include the apparatus of Example 11, wherein the cover is coupled with the socket substrate using a spring-loaded connection to maintain a distance between a surface of the cover and the first side of the socket substrate when the cantilever portion is in an unloaded state. Example 13 may include the apparatus of Example 11, wherein the cover includes alignment features to facilitate alignment between the cover and the socket substrate and alignment features to facilitate alignment between the cover and the die package. Example 14 may include the apparatus of Example 11, wherein the cover is composed of a unitary, molded body of polymer. Example 15 may include the apparatus of any of Examples 11-14, wherein the first side and surfaces of the socket substrate in the first opening are plated with a metal.

According to various embodiments, the present disclosure describes another method. Example 16 of a method may include providing a socket assembly including a socket substrate having a first side and a second side disposed opposite to the first side, a first opening formed through the socket substrate, an electrical contact disposed in the first opening and configured to route electrical signals between the first side and the second side of the socket substrate, the electrical contact having a cantilever portion that extends beyond the first side, a cover having a first side and a second side disposed opposite to the first side, and a second opening formed through the cover and configured to accommodate the cantilever portion such that a first portion of the cover is configured to contact the cantilever portion and a second portion of the cover serves as a barrier to prevent overdeflection of the cantilever portion when loading a die package on the cover, and coupling the electrical contact with a circuit board, wherein the electrical contact is configured to electrically couple with a die package. Example 17 may include the method of Example 16, wherein the cover is coupled with the socket substrate using a spring-loaded connection to maintain a distance between a surface of the cover and the first side of the socket substrate when the cantilever portion is in an unloaded state. Example 18 may include the method of Example 16, wherein the cover includes alignment features to facilitate alignment between the cover and the socket substrate and alignment features to facilitate alignment between the cover and the die package. Example 19 may include the method of Example 16, wherein the cover is composed of a unitary, molded body of polymer. Example 20 may include the method of any of Examples 16-19, wherein the first side and surfaces of the socket substrate in the first opening are plated with a metal. Example 21 may include the method of any of Examples 16-19, further comprising coupling the die package with the electrical contact.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
   a socket substrate having a first side and a second side disposed opposite to the first side;
   a first opening formed through the socket substrate;
   an electrical contact disposed in the first opening and configured to route electrical signals between the first side and the second side of the socket substrate, the electrical contact having a cantilever portion that extends beyond the first side;
   a cover having a first side and a second side disposed opposite to the first side, the cover positioned on the first side of the socket substrate;
   a spring to maintain the cover at a distance from the socket substrate in an unloaded state, and to compress and allow the cover to be pressed against the first side of the socket substrate in a loaded state; and
   a second opening formed through the cover and configured to accommodate the cantilever portion such that a first portion of the cover is configured to contact the cantilever portion and a second portion of the cover serves as a barrier to prevent overdeflection of the cantilever portion when loading a die package on the cover, the second portion of the cover to contact a portion of the electrical contact other than the cantilever portion to prevent overdeflection of the cantilever portion.

2. The apparatus of claim 1, wherein the cover includes:
   alignment features to facilitate alignment between the cover and the socket substrate; and
   alignment features to facilitate alignment between the cover and the die package.

3. The apparatus of claim 1, wherein the cover is composed of a unitary, molded body of polymer.

4. The apparatus of claim 1, wherein the first side and surfaces of the socket substrate in the first opening are plated with a metal.

5. A method comprising:
   providing a socket assembly including:
      a socket substrate having a first side and a second side disposed opposite to the first side,
      a first opening formed through the socket substrate,
      an electrical contact disposed in the first opening and configured to route electrical signals between the first side and the second side of the socket substrate, the electrical contact having a cantilever portion that extends beyond the first side,
      a cover having a first side and a second side disposed opposite to the first side,
      a spring to maintain a distance between the cover and the socket substrate in an unloaded state; and
      a second opening formed through the cover and configured to accommodate the cantilever portion such that a first portion of the cover is configured to contact the cantilever portion and a second portion of the cover serves as a barrier to prevent overdeflection of the cantilever portion when loading a die package on the cover, the second portion of the cover to contact a portion of the electrical contact other than the cantilever portion to prevent overdeflection of the cantilever portion; and coupling the electrical contact with a circuit board by transitioning to a loaded state via compressing the spring and allowing the cover to be pressed against the socket substrate, wherein the electrical contact is configured to electrically couple with a die package.

6. The method of claim 5, wherein the cover includes:

alignment features to facilitate alignment between the cover and the socket substrate; and alignment features to facilitate alignment between the cover and the die package.

7. The method of claim 5, wherein the cover is composed of a unitary, molded body of polymer.

8. The method of claim 5, wherein the first side and surfaces of the socket substrate in the first opening are plated with a metal.

9. The method of claim 5, further comprising:

coupling the die package with the electrical contact.

10. The apparatus of claim 1, wherein the spring includes a spring structure.

11. The apparatus of claim 1, wherein the spring includes the cantilever portion of the electrical contact.

* * * * *